United States Patent
Steel et al.

(10) Patent No.: US 6,782,244 B2
(45) Date of Patent: Aug. 24, 2004

(54) SEGMENTED POWER AMPLIFIER AND METHOD OF CONTROL

(75) Inventors: Victor E. Steel, Oak Ridge, NC (US); Jon D. Jorgenson, Greensboro, NC (US); Khoi Tam Vu, Jamestown, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 346 days.

(21) Appl. No.: 09/810,009

(22) Filed: Mar. 16, 2001

(65) Prior Publication Data

US 2002/0132652 A1 Sep. 19, 2002

(51) Int. Cl.$^7$ ............................................... H04Q 11/12
(52) U.S. Cl. ........................... 455/127.1; 455/127.3; 455/253.2; 330/310
(58) Field of Search ....................... 455/127, 341, 455/572, 574, 127.1, 575.1, 127.3, 550.1, 127.2, 144, 194.2, 232.1, 253.2, 248.1; 330/51, 197, 310, 278, 288, 285, 295, 84, 124 R, 126, 286, 284, 54; 375/295, 297

(56) References Cited

U.S. PATENT DOCUMENTS

| | | | | |
|---|---|---|---|---|
| 4,439,744 A | * | 3/1984 | Kumar et al. ............... | 330/285 |
| 4,598,252 A | * | 7/1986 | Andricos ..................... | 330/51 |
| 5,256,987 A | * | 10/1993 | Kibayashi et al. .......... | 330/295 |
| 5,530,404 A | | 6/1996 | Debroux ..................... | 330/278 |
| 5,541,554 A | | 7/1996 | Stengel et al. ............... | 330/51 |
| 5,548,248 A | * | 8/1996 | Wang .......................... | 330/288 |
| 5,834,975 A | * | 11/1998 | Bartlett et al. .............. | 330/278 |
| 5,838,031 A | * | 11/1998 | Kobayashi et al. ......... | 257/197 |
| 5,861,776 A | | 1/1999 | Swanson ................. | 330/124 R |
| 5,862,461 A | | 1/1999 | Yoshizawa et al. ......... | 455/127 |
| 5,872,481 A | | 2/1999 | Sevic et al. .................. | 330/51 |
| 6,069,525 A | * | 5/2000 | Sevic et al. .................. | 330/51 |
| 6,339,361 B1 | * | 1/2002 | Khesbak et al. ............ | 330/285 |
| 6,356,150 B1 | * | 3/2002 | Spears et al. ............... | 330/145 |
| 2002/0132652 A1 | * | 9/2002 | Steel et al. .................. | 455/574 |

* cited by examiner

Primary Examiner—Edward F. Urban
Assistant Examiner—C. Chow
(74) Attorney, Agent, or Firm—Withrow & Terranova, PLLC

(57) ABSTRACT

An amplifier provides two or more selectively enabled amplifier segments allowing a source signal to be amplified with a selectable output power. A bias circuit responsive to a bias control signal enables selectable combinations of one or more amplifier segments, thus allowing selection of a desired output power. Selecting a desired output signal power via the bias control signal corresponds to selecting an overall amplifier quiescent current that decreases with decreasing output signal power. Thus, the amplifier permits a controlling system, such as a mobile terminal (e.g., cellular telephone) to amplify a transmit signal with a selectable transmit signal output power and corresponding level of amplifier quiescent power consumption. Preferably, each segment comprises one or more transistor amplification stages which, when enabled by the bias circuit, are biased to permit maximum power linear amplification for the transmit signal.

27 Claims, 6 Drawing Sheets

SEGMENTED POWER AMPLIFIER AND METHOD OF CONTROL

FIELD OF THE INVENTION

This invention generally relates to communications systems, and particularly relates to controlling the output power and corresponding current consumption of a power amplifier.

BACKGROUND OF THE INVENTION

Mobile wireless communications systems have numerous and oftentimes challenging design requirements not commonly shared with other types of communications equipment. For example, mobile terminals, such as cellular telephones, are expected to operate on battery power for significant intervals of time between re-charging. Battery life represents a key performance benchmark used by the consuming public to evaluate the relative desirability of available mobile terminals. Indeed, "talk time" performance, which refers to the total length of time the mobile terminal will operate from a fully charged battery, is critical to many users. As designers continue reducing mobile terminal size and, consequently, battery capacity, commensurate reductions in mobile terminal power consumption are paramount.

Other challenges arise from the wireless communications standards themselves. IS-95, for example, is a Code-Division Multiple-Access (CDMA) 800 MHz digital cellular standard that requires mobile terminals to dynamically control their maximum transmit signal power over a defined range during operation, in accordance with changing conditions within the communications system. (Wide-band CDMA systems have similar power control requirements.) Transmit signal linearity must be maintained over the range of required transmit signal power. Both IS-95 and TIA/EIA-136 (an 800/1900 MHz Time-Division Multiple-Access digital cellular standard) require linear transmit signal amplification to meet strict signal fidelity requirements, and to avoid interference with other mobile terminals simultaneously active within the same service area.

Adjacent channel power ratio (ACPR) represents a key benchmark in evaluating transmitter performance and is commonly used to assess a mobile terminal's potential for interference. Mobile terminals typically use some form of power amplifier for transmit signal amplification. To meet the aforementioned linearity requirements, transmit signal power amplifiers are commonly biased at an operating point providing linear amplification at the maximum required transmit signal power. This ensures transmit signal linearity when the mobile terminal operates at maximum transmit signal power, but results in relatively high levels of power amplifier quiescent current (bias current).

Such levels are power amplifier quiescent current are needlessly high when the mobile terminal is not required to operate at maximum transmit power. In light of the demanding battery life requirements imposed on mobile terminals, such inefficiency is particularly significant. Indeed, the transmitter in a typical mobile terminal represents a dominant component of operating current consumption, and thus represents a key area of concern in ensuring competitive "talk time" performance ratings.

Reducing amplifier quiescent current as a function of output power represents one solution to this problem. Such schemes commonly employ a control voltage that varies amplifier quiescent current, as supplied by a bias network. This approach requires some form of analog control based on feeding back a signal proportionate to output power, which results in undesirable circuit complications. More importantly, varying the quiescent current of the power amplifier can result in degraded linearity, which results from changing the operating point(s) of the transistor(s) comprising the power amplifier. This can have serious implications for transmitted signal fidelity. Strict limits on ACPR allowed by standards such as IS-95 become a significant problem if linearity is compromised.

Another existing approach to quiescent current control entails using a switched-gain, multi-stage amplifier where the final stage of the amplifier is shut off and bypassed for low power operation. This action reduces the quiescent current of the amplifier at low power. This approach has several drawbacks, including large gain discontinuities and compromised linear output power adjustment.

Because overall amplifier gain depends on the final gain stage, switching it out for low power operation represents a substantial transmit signal gain discontinuity when changing from full power to low power operation. Also, because such approaches typically leave active only a driver stage in the low power mode, the available linear output power can be severely limited. A further drawback of the switched-stage approach is that switching out the final stage causes a large change in amplifier conduction angle, thus leaving this approach unsuitable for signaling applications requiring phase continuity to maintain the integrity of transmitted information.

Thus, there remains a need for a power amplifier that provides linear signal amplification over a range of selectable output power, while also providing relatively consistent signal gain and phase conduction angle over this range. Further, the needed power amplifier operates with a quiescent current proportionate to its selected output power, thereby reducing its quiescent current consumption at lower levels of output power.

SUMMARY OF THE INVENTION

The present invention provides both methods and apparatus for controlling the maximum output signal power and quiescent operating current of a power amplifier. A segmented power amplifier comprises two or more parallel amplifier segments that may be selectively enabled by a controlling system. When enabled, an amplifier segment provides an amplified output signal based on amplifying a common source signal received by the segmented power amplifier. These amplified source signals combine to form the final amplifier output signal from the segmented power amplifier. Overall amplifier quiescent current and maximum amplifier output signal power are both dependent upon the number of simultaneously enabled amplifier segments.

Exemplary embodiments of the segmented power amplifier of the present invention operate on radio frequency signals. Thus, a mobile terminal or other wireless communications device may advantageously use the segmented power amplifier of the present invention for transmit signal amplification. This allows the mobile terminal to transmit at different output power levels based on selectively enabling one or more amplifier segments in differing combinations. Because the quiescent current of the segmented power amplifier also depends upon the number of simultaneously enabled amplifier segments, the mobile terminal may reduce its operating current by enabling fewer amplifier segments in accordance with its transmit signal power requirements.

Preferably, each amplifier segment comprises a like number of one or more transistor amplification stages, with each stage enabled or disabled via a bias signal. A bias circuit, comprising a portion of the segmented power amplifier, selectively provides these bias signals to each amplifier segment in accordance with a bias control signal. Thus, a controlling system may disable all amplifier segments, or selectively enable one or more segments in a desired combination via the bias control signal. In exemplary embodiments, the bias circuit comprises a plurality of bias networks, with groups of bias networks associated with each amplifier segment. The bias control signal controls these groups of bias networks such that all amplification stages within a given amplifier segment may be commonly enabled or disabled.

In exemplary embodiments, the bias circuit biases all of the amplification stages in an amplifier segment either on or off (enabled or disabled), as detailed above, in response to the bias control signal. Preferably, when an amplifier segment is enabled, each amplification stage is biased to an operating point providing maximum linear signal amplification for that individual stage. Thus, when biased on, the overall amplifier segment provides linear signal amplification of the source signal. While each amplifier segment preferably provides similar signal gain, the segments may have substantially different levels of maximum linear output power. This allows a controlling system more flexibility in optimizing transmit signal power and quiescent current consumption, as given amplifier segments may be optimized for efficient operation at different levels of segment output power. Design of the individual transistor amplification stages comprising each segment provides this opportunity to set the maximum output power and quiescent current for each segment.

In exemplary embodiments, the segmented power amplifier of the present invention avoids large signal gain discontinuities between its possible combinations of enabled amplifier segments. That is, the segmented power amplifier of the present invention provides substantially the same signal gain whether one, all, or a combination of parallel amplifier segments are simultaneously enabled. Thus, while the maximum output power available from the segmented power amplifier of the present invention varies as a function of which parallel amplifier that simultaneously enabled, the signal gain does not vary appreciably. Further, the segmented power amplifier of the present invention additionally avoids significant changes in conduction angle between its different levels of maximum available output power. These benefits, as well as other advantages and features, will become apparent in the following detailed discussion.

DETAILED DESCRIPTION OF THE INVENTION

Figure 1:
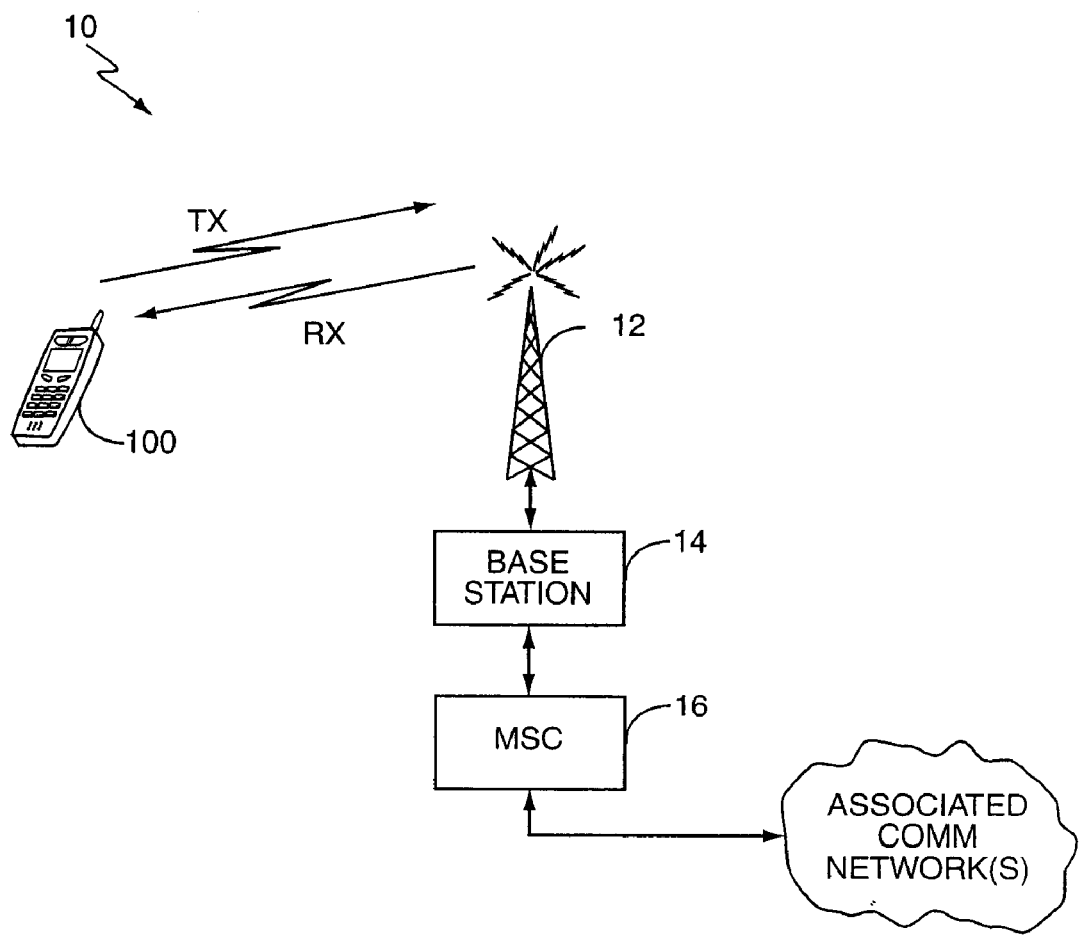
FIG. 1 illustrates an exemplary communications system 10 that may advantageously use the segmented power amplifier of the present invention.

FIG. 1 depicts a communications system 10, including a mobile terminal 100 advantageously including the segmented power amplifier of the present invention. Communications system 10 further includes a communications tower 12, a base station 14, and a mobile switching center 16. A user of mobile terminal 100 communicates with other system users, or users of other communications networks, via wireless signaling between mobile terminal 100 and communications tower 12.

Figure 2:
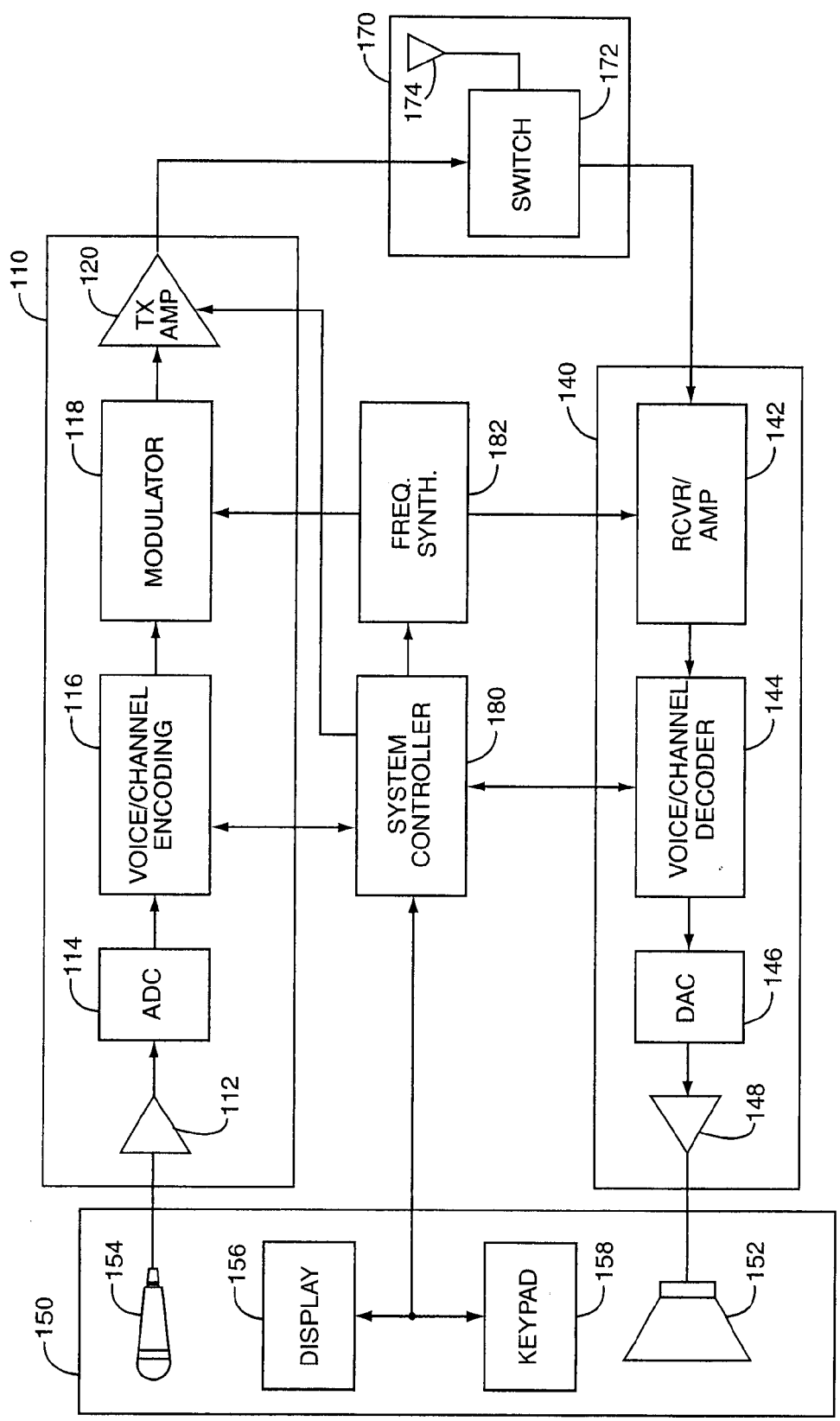
FIG. 2 provides more detail regarding the mobile terminal of FIG. 1, and illustrates an exemplary transmit signal chain location for the segmented power amplifier of the present invention.

FIG. 2 depicts an exemplary mobile terminal 100. From a top-level perspective, mobile terminal 100 includes a user interface 150, a transmitter 110, a receiver 140, an antenna assembly 170, a system controller 180, and frequency synthesizer 182. In operation, user interface 150 receives audio input including user voice, which is processed by transmitter 110 to form a transmit signal broadcast to communications tower 12 by antenna assembly 170. Receiver 140 decodes signals received from communications tower 12 via antenna assembly 170 to recover speech and other audio information, which is output to user interface 150.

User interface 150 includes a microphone 154 for receiving speech and other sounds from the user. A buffer amplifier 112 in transmitter 110 provides analog-to-digital converter (ADC) 114 with a signal suitable for digitization. A signal processor 116 operates on the digitized output from ADC 114 to form an encoded baseband digital signal. Modulator 118 includes a baseband signal generator/encoder and signal modulators (not shown), which operate on the baseband digital signal to form a transmit signal having a desired carrier frequency determined by an output from frequency synthesizer 182. The segmented power amplifier 120 of the present invention amplifies the transmit signal before being broadcast from antenna 174 included in antenna assembly 170.

In many types of communications systems, such as those governed by the IS-95 specifications, transmit signal power must be carefully controlled to minimize the interference between mobile terminals 100 simultaneously operating within a given service area of communications system 10. Segmented power amplifier 120 allows mobile terminal 100 to select a desired transmit signal power while simultaneously controlling amplifier quiescent current. Segmented amplifier 100 is designed such that lower transmit signal powers correspond with lower levels of amplifier quiescent current, thus allowing mobile terminal 100 to achieve significant power savings when operating segmented amplifier 120 at lower power levels.

Receiver 140 receives signals from communications tower 12 through antenna assembly 170. Receiver/amplifier 142 typically includes signal conditioning, such as filtering, amplification, and down-conversion (not shown). A receiver processor 144, which may be a DSP or ASIC, processes the output from receiver/amplifier 142 to extract signaling and speech information from the received signal. Signaling data includes control information, such as channel assignments and required transmit power adjustments. Such control information may be relayed to system controller 180 for further action or control output adjustment. Speech information is converted from digital to analog format using digital-to-analog converter (DAC) 146. An output audio amplifier 148 may buffer the DAC output to provide adequate drive for loudspeaker 152. Thus, loudspeaker 152 reproduces speech and other sounds from a remote user based on information extracted from the received signal.

Figure 3:
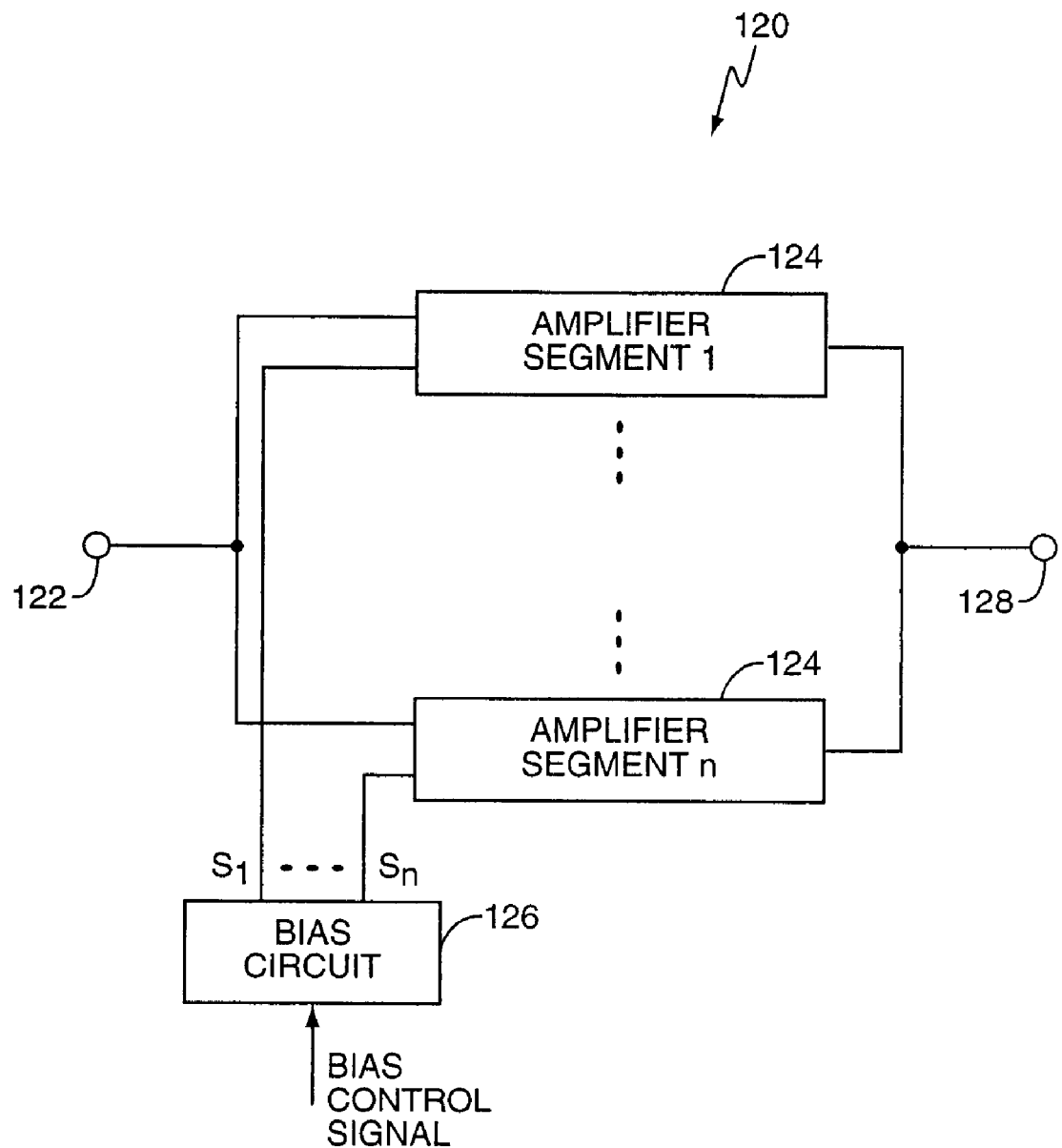
FIG. 3 provides a simplified block diagram for an exemplary embodiment of the segmented power amplifier of the present invention.

FIG. 3 provides a simplified illustration of an exemplary embodiment of the segmented power amplifier of the present invention. Segmented amplifier 120 comprises two or more parallel amplifier segments 124. A common input terminal (source input) 122 provides an input connection to each amplifier segment 124. A segment output from each amplifier segment 124 connects together to form a final output 128. Thus, each active (enabled) amplifier segment 124 amplifies a source signal received through source input 122, and the amplified output signal from each active amplifier segment 124 combines with the output from the other simultaneously active amplifier segments 124 to form the final amplifier output signal provided on final output 128. Bias circuit 126 selectively provides bias signals to each amplifier segment according to the bias control signal. Bias circuit 126 preferably provides multiple bias signals, one per transistor amplification stage 200 (not shown in FIG. 3) in each amplifier segment 124, but controls these bias signals in a manner allowing the bias control signal to enable or disable an entire amplifier segment 124.

Figure 4:
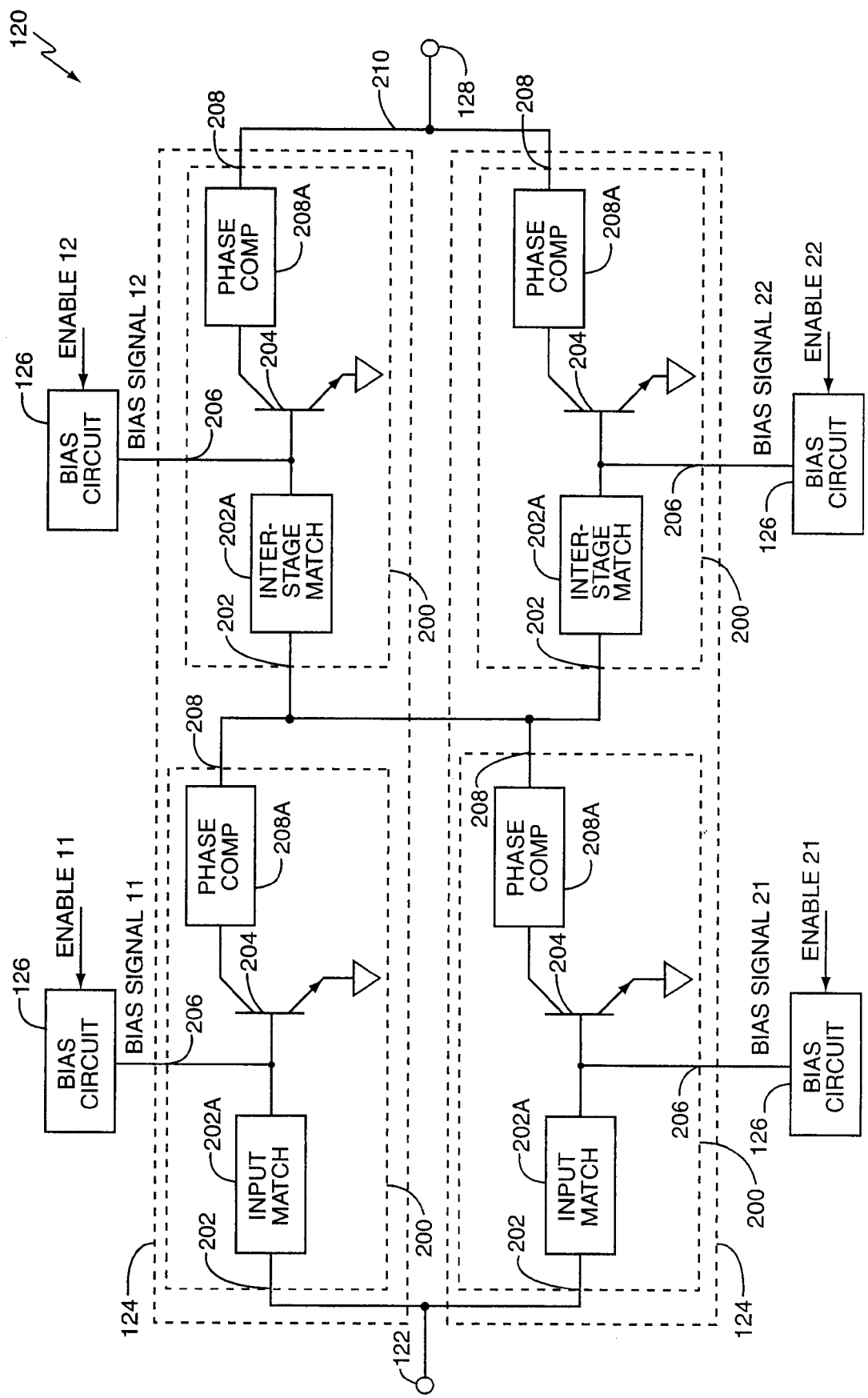
FIG. 4 provides a more detailed block diagram for an exemplary embodiment of the segmented power amplifier of the present invention.

FIG. 4 provides a more detailed illustration of an exemplary segmented power amplifier 120. FIG. 4 depicts a segmented power amplifier 120 comprising two parallel amplifier segments 124—it should be understood that the present invention may be practiced with essentially any number of parallel amplifier segments 124 numbering two or greater. Each amplifier segment 124 comprises a like number of transistor amplification stages 200. While FIG. 4 illustrates two amplification stages 200 per amplifier segment 124, the present invention may be practiced with essentially any number of one or more amplification stages 200 per amplifier segment 124.

When more than one amplification stage 200 is used per amplifier segment 124, successive stages 200 within an amplifier segment 124 are wired in series fashion. Thus, the signal gain for a given segment 124 depends upon the overall gain of its series amplification stages 200. Preferably, the individual amplifier segments 124 have similar signal gains such that the overall amplifier signal gain from source input 122 to final output 128 does not vary significantly as the controlling system selectively enables varying combinations of amplifier segments 124. Of course, the maximum output power available from a given amplifier segment may vary significantly between segments.

In an exemplary embodiment, each amplification stage 200 includes a stage input 200, a stage output 208, a bias input 206, and a transistor amplifier arrangement 204 disposed between the stage input 202 and stage output 208. The bias input 206 receives a bias signal from the bias circuit 126. This bias signal establishes the bias or operating point of transistor amplifier arrangement 204. Preferably, transistor amplifier arrangement 204 comprises a single Heterojunction Bipolar Transistor (HBT), as shown in FIG. 4, and the bias circuit 126 selectively provides a bias signal that biases the HBT comprising transistor amplifier arrangement 204 for linear signal amplification at maximum transistor output power. Thus, in exemplary embodiments of the present invention, the transistor amplifier arrangements 204 in each amplification stage 200 within an enabled amplifier segment 124 are each biased for maximum power linear signal amplification. Of course, when an amplifier segment 124 is disabled, its transistor amplifier arrangement(s) 204 are biased off.

Indium Phosphide/Indium Gallium Arsenide (InP/InGaAs) HBTs are readily fabricated using conventional optical lithography techniques and offer excellent fabrication uniformity and high operating cutoff frequencies. While these attributes make HBTs desirable for use in some exemplary embodiments of the present invention, other types and arrangements of transistors may be used in other embodiments of the present invention. For example, those skilled in the art will readily appreciate that dual-gate FETs may be used in place of HBTs, and further that each transistor amplification stage 204 may comprise two or more transistors arranged in various amplifier topologies. Thus, the present invention is not limited to using a single, common-collector HBT transistor per transistor amplification stage 200.

As earlier explained, controlling amplifier quiescent current represents a key approach in minimizing unnecessary power dissipation in battery-operated equipment, such as mobile terminals. In existing systems with conventional power amplifiers, the power amplifier may be initially biased such that its operating point yields linear signal amplification at maximum output power. In response to decreased output signal power requirements, such existing systems reduce power amplifier quiescent current in proportion to the reduced power requirements. Altering the quiescent current, however, changes the operating point of the transistors comprising the conventional power amplifier. Changing the operating point of the power amplifier can result in undesirable changes in signal amplification characteristics. For example, as earlier noted, the conventional power amplifier may operate at a point where its transistors are close to their cutoff point. This can result in significant and unwanted signal amplification non-linearity.

In an exemplary embodiment of the present invention, each amplification stage 200 in each parallel amplifier segment 124 is either biased on to operate linearly at a maximum output power, or is biased off to avoid interfering with a signal amplification of any enabled amplifier segments 124. Unlike a conventional power amplifier, the segmented power amplifier 120 of the present invention can include multiple parallel amplifier segments 124, with each segment 124 including amplification stages 200 where the transistor amplifiers 204 are fabricated for efficient operation at a desired output power level.

For example, even though segmented power amplifier 120 operates at differing levels of overall maximum output power based on which amplifier segments 124 are simultaneously enabled, each amplifier segment 124 may be fabricated such that the transistors comprising its one or more amplification stages 200 operate with roughly the same emitter current density, regardless of the particular combination of enabled amplifier segments 124. A segmented power amplifier 120 might include two parallel amplifier segments 124 (as illustrated in FIG. 4). One segment may be designed as a lower power segment 124, while the remaining segment may be designed as a higher power segment 124.

For lower power operation, only the lower power segment 124 is enabled. This lower power segment 124 may comprise amplification stages 200 including transistors with relatively small active emitter areas as compared to the emitter area size of transistors comprising the amplification stages 200 in the higher power segment 124. Thus, even though the absolute current output from segmented power amplifier 120 during low power operation-with the low-power segment 124 enabled-is less than during higher power operation-with at least the higher power segment 124 enabled-the transistor current densities may be similar for the lower power segment 124 and higher power segment 124.

Thus, in exemplary embodiments, the segmented power amplifier 120 of the present invention avoids the problems associated with varying a transistor's operating point by operating all transistors in an enabled amplifier segment 124 at a fixed, linear operating point. Overall quiescent current of segmented power amplifier 120 is a function of the number of simultaneously enabled amplifier segments 124. Thus, a controlling system selects a desired level of amplifier quiescent current by choosing which if any, parallel amplifier segments 124 comprising segmented power amplifier 120 are enabled.

Selecting different levels of maximum output power based on simultaneously enabling differing numbers and/or combinations of parallel amplifier segments 124 rather than employing the existing approach of switching out one or more gain stages or varying a transistor's operating point, allows the segmented amplifier of the present invention to offer relatively consistent signal gain regardless of the number of segments 124 that are enabled. Further, because the transistor(s) comprising the amplification stages 200 in a given amplifier segment 124 are, in exemplary embodiments, always biased to a consistent operating point when the given segment 124 is enabled, the conduction angle of the segmented power amplifier 120 of the present invention does not appreciably change, regardless of the selected combination of enabled amplifier segments 124.

Preferably, as shown in FIG. 4, corresponding stage inputs 202 and stage outputs 208 are interconnected with each other between the amplifier segments 124. Further, the stage input 202 of the first amplification stage 200 in each amplifier segment 124 preferably includes a source impedance matching circuit 202A. This circuit matches the input impedance of the amplifier segments 124 to the source impedance of the input signal. If more than one amplification stage 200 is used per amplifier segment 124, successive amplification stages 200 include inter-stage impedance matching circuits 202A, matched to the impedance of the preceding amplification stage outputs 208. Also, each stage output 208 preferably includes a phase compensation circuit 208A to minimize the relative phase difference of amplified signals within all enabled amplifier segments 124.

FIG. 4 depicts bias circuit 126 as providing a plurality of bias signals, with one bias signal per amplification stage 200. In such an arrangement, bias circuit 126 may comprise individual bias networks, with groups of these bias networks associated with each amplifier segment 124. FIG. 4 depicts individual enable signals (e.g., $ENABLE_{11}$ ... $ENABLE_{12}$, $ENABLE_{21}$ ... $ENABLE_{22}$), but other embodiments of the present invention may use common enable lines for an entire group of bias circuits 126 associated with a given amplifier segment 124. As previously explained, bias circuit 126 uses its output bias signals to selectively enable or disable different combinations of amplifier segments 124 in response to an external control signal.

Exemplary embodiments of the present invention include a bias circuit 126 responsive to a digital bias control signal. Preferably, bias circuit 126 includes a digital signal input for each amplifier segment 124. In this configuration, bias circuit 126 provides bias signals to each amplifier segment 124 corresponding to each asserted digital signal input. Thus, a segmented power amplifier 120 having four parallel amplifier segments 124 might include a bias circuit 126 having four digital input lines, with each line enabling/disabling a different amplifier segment 124.

In other embodiments, segmented power amplifier 120 includes a bias circuit 126 having a digital interface suited for receiving binary values corresponding to a desired combination of enabled amplifier segments. Such an interface might be configured for access via a conventional microprocessor data/memory bus, or might be configured for access via serial interface lines. These types of digital interfaces are well understood in the art. In still other embodiments of the present invention, segmented power amplifier 120 may include a bias circuit having an analog interface that permits selectively enabling different amplifier segments 124 based on varying the level of the input voltage or current.

Figure 5:
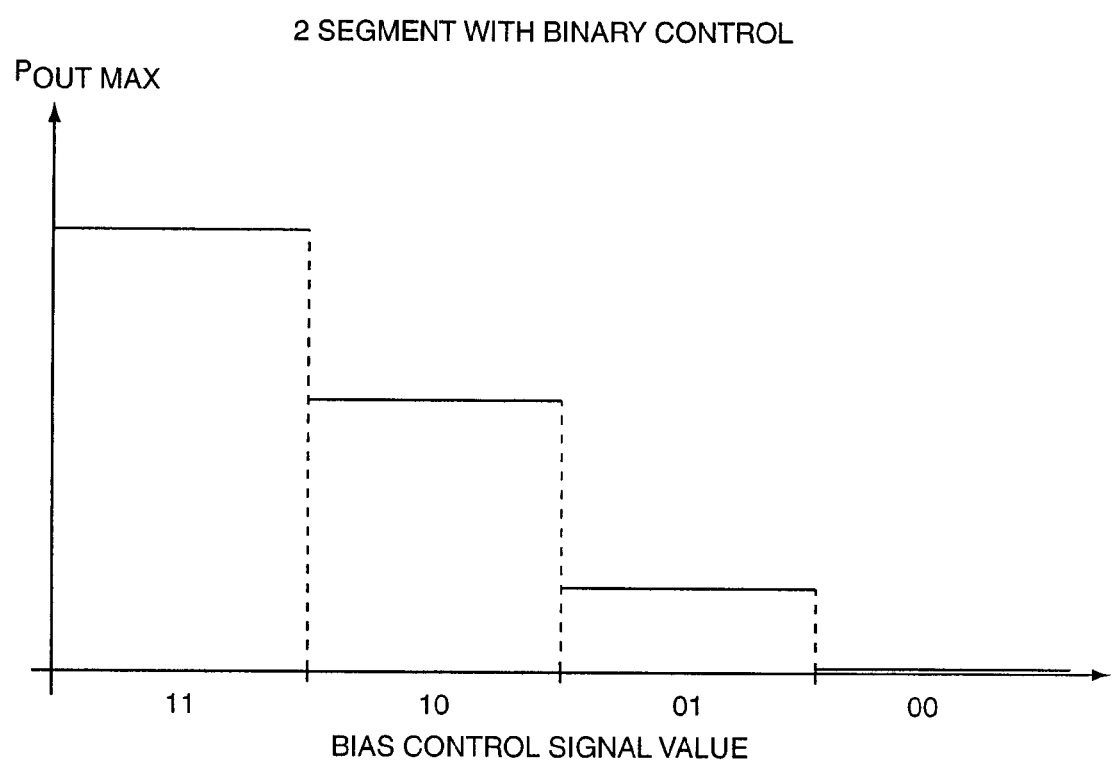
FIG. 5 graphs maximum output power versus bias control signal value for an exemplary two-segment segmented power amplifier.
Figure 6:
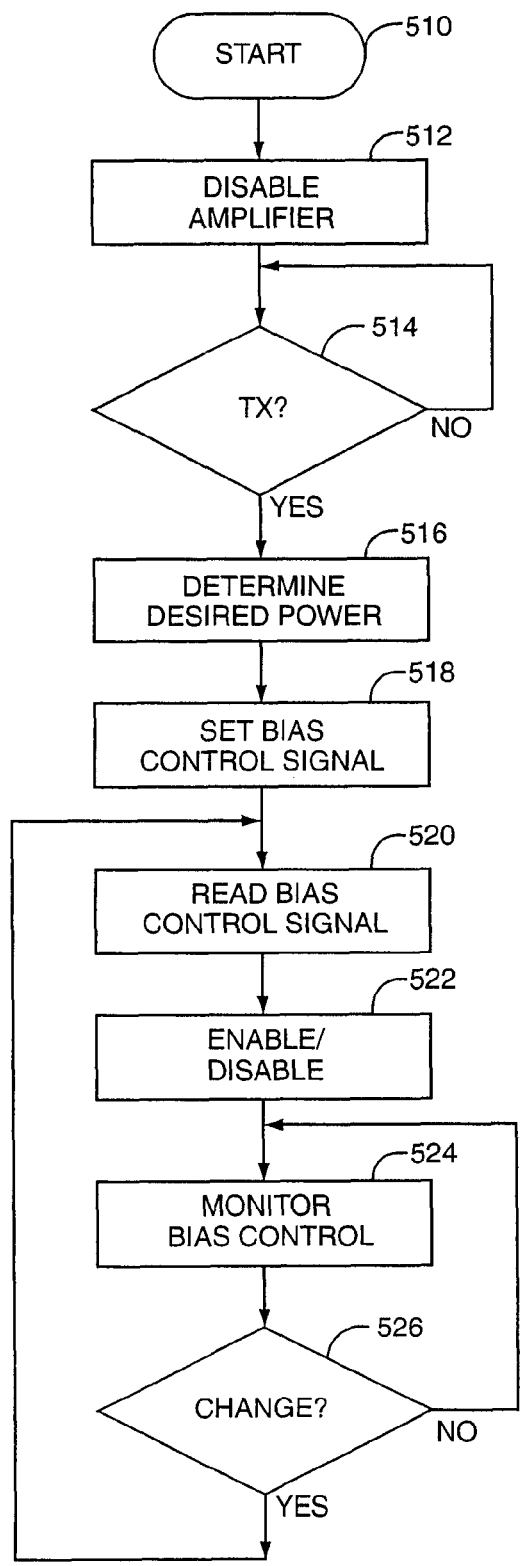
FIG. 6 is a simplified flow diagram illustrating operating logic for an exemplary embodiment of the segmented power amplifier of the present invention.

FIG. 5 plots maximum output power versus a binary-valued bias control signal for an exemplary segmented power amplifier 120. $P_{OUT\_MAX}$ represents the maximum output signal power available from segmented power amplifier 120 for a given bias control signal value. FIG. 6 assumes a segmented power amplifier 120 having first and second amplifier segments 124. When the bias control signal has a value of "11," both amplifier segments 124 are enabled (biased on) and segmented power amplifier 120 provides its maximum available output signal power, based on the combined power contributions of the first and second amplifier segments 124. Adjusting the bias control signal to a value of "10" disables the first amplifier segment 124 and the maximum output power of segmented power amplifier 120 equals the maximum output power of the second amplifier segment 124. Further adjusting the bias control signal to a value of "01" disables the second amplifier segment 124 and re-enables the first segment 124. At this point, the maximum output power of segmented power amplifier 120 is the maximum power available from just the first segment 124. Setting the bias control signal to a value of "00" disables both first and second segments 124, thereby disabling segmented power amplifier 120.

Note that, in the illustrated example, the maximum power available from the first segment 124 is less than that available from the second segment 124. Of course, a greater number of amplifier segments 124 would provide a greater number of available levels of output power. Since the maximum output power available from each segment 124 may be different, the overall maximum output power of the segmented power amplifier 120 may change slightly if a low-power segment 124 is enabled or disabled, or may change significantly if a high-power segment 124 is enabled or disabled.

FIG. 6 provides a greatly simplified logic flow diagram associated with an exemplary embodiment of the present invention. FIG. 6 depicts the operation of both a controlling system (mobile terminal 100) and an exemplary embodiment for the segmented power amplifier 120 of the present invention. Operation begins (510) with the segmented power amplifier 120 disabled (512). Disabling segmented power amplifier 120 may entail adjusting the bias control signal provided to it such that none of its parallel amplifier segments 124 are enabled (biased on). Mobile terminal 100 continuously determines whether transmitter operations are required (NO from 514). If mobile terminal 100 does determine that must actively transmit (YES from 514), it determines a desired maximum transmit signal power level (516), and generates a bias control signal corresponding to this desired level (518). From the perspective of segmented power amplifier 120, it must "read" the bias control signal it receives from mobile terminal 100 (520). Of course, reading the bias control signal may simply mean that segmented power amplifier 120 adjusts its bias circuit 126 accordingly in response to changes in the input control signal. In some embodiments, the segmented power amplifier 120 may indeed read a binary or analog value from the bias control signal, and set bias circuit 126 accordingly. In any case, segmented power amplifier 120 enables and disables a specific combination of parallel amplifier segments 124 in accordance with the present setting of the bias control signal (522).

Thereafter, segmented power amplifier 120 "monitors" the bias control signal to determine if different a combination of enabled and disabled amplifier segments 124 has been selected (524). Monitoring may imply periodically checking the value of the bias control signal, or may simply mean that segmented power amplifier 120 remains responsive to changes in the bias control signal during operation. If there are no changes in the bias control signal (NO from 526), bias circuit 126 of segmented power amplifier 120 maintains its bias signal outputs corresponding to the value of the bias control signal. If the bias control signal changes (YES from 526), bias control circuit 126 response by enabling/disabling a new combination of parallel amplifier segments 124 corresponding to the value of the newly changed bias control signal.

As discussed earlier, segmented power amplifier 120 may include one or more parallel amplifier segments 124 optimized for efficient linear operation at the lower current signal currents associated with lower transmit signal output power, and other segments 124 optimized for efficient operation at high output power. Thus, the mobile terminal 100 may have a set of defined combinations of amplifier segments 124 that are selectively enabled, based on whether low, high, or intermediate levels of transmit signal output power are required.

The present invention allows tremendous flexibility in both implementation and use. Thus, the foregoing discussion and accompanying illustrations simply present exemplary embodiment of the present invention, and should not be construed as limiting the scope of the invention. Those skilled in the art will immediately appreciate the many possible variations afforded by the present invention. Such variations do not depart from the scope and spirit of the present invention and, indeed, are embraced herein.

As noted, the segmented power amplifier 120 of the present invention allows a controlling system, such as a mobile terminal 100, to configure the segmented power amplifier 120 for two or more levels of maximum amplifier output power based on enabling different combinations of parallel amplifier segments 124 comprising the segmented power amplifier 120. Each amplifier segment comprises a like number of amplification stages 200 (transistor-based amplification stages). The present invention may be practiced with two or more parallel amplifier segments 124, and the segments 124 may comprise like numbers of one or more amplification stages 200.

Although exemplary embodiments of the present invention use HBTs in the amplification stages 200, this is not a limitation of the invention. Dual-gate FETs and other types of transistor amplifiers may be used as indicated by the particular needs of a given design or fabrication technology. Further, the present invention is not limited to inclusion in mobile terminals 100. Indeed, many other types of systems, including other communications equipment, may advantageously use the segmented power amplifier 124 of the present invention. Thus, the scope of the present invention is limited only by the attached claims and all equivalents thereto.

What is claimed is:

1. A radio frequency amplifier comprising:
    a signal input for receiving a source signal;
    a plurality of selectively enabled amplifier segments connected to said signal input, each providing an amplified source signal via a segment output when enabled;
    a bias circuit selectively enabling a desired combination of said amplifier segments via one or more bias signals responsive to a bias control signal; and
    a final output connected to said segment outputs providing an amplifier output signal based on combining said amplified source signals and having an output power determined by said desired combination of enabled amplifier segments;
    wherein said plurality of amplifier segments each comprise a plurality of amplification stages, each of said amplification stages comprising a stage input, a stage output, and a transistor amplifier arrangement disposed between said stage input and stage output, and each said stage input includes an impedance matching circuit and each said stage output includes a phase compensation circuit.

2. The radio frequency amplifier of claim 1 wherein said desired combination of enabled amplifier segments determines a quiescent current of said radio frequency amplifier.

3. The radio frequency amplifier of claim 2 wherein said bias circuit enables said desired combination of said amplifier segments responsive to said bias control signal by biasing a first number of said amplifier segments on and biasing a second number of said amplifier segments off, said first and second numbers totaling said plurality of said amplifier segments.

4. The radio frequency amplifier of claim 3 wherein said amplifier segments biased on by said bias control circuit linearly amplify said source signal and said amplifier segments biased off by said bias circuit behave as high-impedance loads.

5. The radio frequency amplifier of claim 4 wherein said segment outputs from said second number of amplifier segments do not substantially load said amplified signals output from said first number of amplifier segments.

6. The radio frequency amplifier of claim 4 wherein said bias signals provided to said first number of amplifier segments biases each of said first number of amplifier segments such that said linear amplification of said source signal represents a maximum power linear amplification of said source signal.

7. The radio frequency amplifier of claim 1 wherein said desired combination represents one of a possible set of enabled amplifier segment combinations selected via said bias control signal.

8. The radio frequency amplifier of claim 7 wherein said bias circuit includes a digital interface and said bias control signal comprises a binary value corresponding to one of said possible set of enabled amplifier segment combinations.

9. The radio frequency amplifier of claim 1 wherein said amplification stages further include a bias input responsive to one of said one or more bias signals for selectively enabling said transistor arrangement.

10. The radio frequency amplifier of claim 1 wherein said stage input in a first amplification stage in each of said amplifier segments is connected to said signal input and said impedance matching circuit of said first amplification stage matching a source impedance of said source signal.

11. The radio frequency amplifier of claim 10, wherein said amplifier segments each include an equal plurality of said amplifications stages connected in series with said first amplification stage.

12. The radio frequency amplifier of claim 11, wherein said stage inputs and said stage outputs from corresponding amplification stages are interconnected between said plurality of amplifier segments.

13. The radio frequency amplifier of claim 1 wherein said transistor amplifier arrangement comprises a HBT transistor.

14. An amplifier comprising:
a bias circuit adapted to selectively provide bias signals responsive to a bias control signal;
two or more amplifier segments selectively enabled via said bias signals, each comprising a plurality of transistor amplification stages and each adapted to provide an amplified output signal based on amplifying a common source signal when said amplifier segment is enabled; and
a common output connected to an output from each said amplifier segment, said common output adapted to provide a final output signal based on combining said amplified output signals
wherein said two or more amplifier segments comprise at least one first amplifier segments designed for low-power source signal amplification and at least one second amplifier segments designed for higher-power source signal amplification, and said transistor amplification stages each comprise a stage input, stage output, and a hetero-junction bipolar transistor (HBT) amplifier disposed between said stage input and said stage output.

15. The amplifier of claim 14 wherein said HBT amplifier comprises a single HBT in a common-collector configuration.

16. The amplifier of claim 14 wherein said HBT amplifier further includes a bias input adapted to receive one or more of said bias signals from said bias circuit.

17. The amplifier of claim 14 wherein said HBT transistors in said first segments and said second segments are fabricated such that transistor active emitter current densities in said first segment and said second segments are comparable.

18. The amplifier of claim 14 wherein said bias circuit includes a digital interface adapted to receive said bias control signal.

19. The amplifier of claim 18 wherein said digital interface comprises a discrete input signal line for each of said amplifier segments, and enables said amplifier segments corresponding to asserted input signals on corresponding said input signal lines.

20. The amplifier of claim 18 wherein said digital interface comprises a binary interface adapted to receive a binary control signal, and further adapted to enable one or more of said amplifier segments based on a value of said bias control signal.

21. A method of operating a power amplifier, said method comprising:
providing a segmented power amplifier comprising two or more selectively enabled amplifier segments, each segment adapted to amplify a source signal with a known maximum segment output power when enabled;
determining a desired overall amplifier maximum output power;
enabling one or more of said amplifier segments in a combination corresponding to said desired overall amplifier maximum output power; and
combining an amplified output signal from each said enabled amplifier segment to form a final amplifier output signal having said desired overall amplifier maximum output power;
wherein said amplifier segments each comprise a like number of one or more transistor amplifier stages and each said transistor amplifier stage is fabricated such that one or more transistors comprising each said transistor amplifier stage operate with a desired emitter current density when biased to said transistor operating point.

22. The method of claim 21 wherein said enabling one or more of said amplifier segments in a combination corresponding to said desired overall amplifier maximum output power comprises using a bias circuit that selectively biases one or more transistor amplification stages in each of said amplifier segments on when said amplifier segment is enabled and off when said amplifier segment is not enabled.

23. The method of claim 22 wherein said bias circuit is responsive to a bias control signal, and further wherein a binary value of said bias control signal determines which of said amplifier segments is enabled.

24. The method of claim 21 wherein a mobile terminal includes said segmented power amplifier and performs said steps of determining, enabling, and combining in response to changing transmit signal power requirements.

25. The method of claim 24 further comprising operating said mobile terminal in a digital wireless communications system that communicates said changing transmit signal power requirements to said mobile terminal.

26. The method of claim 21 wherein said enabling one or more of said amplifier segments comprises biasing each transistor amplifier stage within an enabled amplifier segment to a transistor operating point providing linear signal amplification at a maximum output power for each said transistor amplifier stage in said enabled amplifier segment.

27. A method of operating a power amplifier, said method comprising:
providing a segmented power amplifier comprising two or more selectively enabled amplifier segments, each segment adapted to amplify a source signal with a known maximum segment output power when enabled;
determining a desired overall amplifier maximum output power;
enabling one or more of said amplifier segments in a combination corresponding to said desired overall amplifier maximum output power; and
combining an amplified output signal from each said enabled amplifier segment to form a final amplifier output signal having said desired overall amplifier maximum output power;
wherein one or more of said two or more amplifier segments is designed to operate with low levels of quiescent current when enabled, as compared to one or more other said amplifier segments comprising said segmented power amplifier.

* * * * *